United States Patent
Aoki

(10) Patent No.: US 7,639,215 B2
(45) Date of Patent: Dec. 29, 2009

(54) EL DISPLAY HAVING A BLANKING PERIOD, SCANNING PERIOD INCLUDING PRECHARGE OPERATION, AND DISPLAY PERIOD

(75) Inventor: Yoshiro Aoki, Kitamoto (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 791 days.

(21) Appl. No.: 11/386,748

(22) Filed: Mar. 23, 2006

(65) Prior Publication Data

US 2006/0221011 A1  Oct. 5, 2006

(30) Foreign Application Priority Data

Mar. 31, 2005  (JP) ............................. 2005-105101

(51) Int. Cl.
  *G09G 3/20*  (2006.01)
(52) U.S. Cl. ........................................................ 345/76
(58) Field of Classification Search ................... 345/76
  See application file for complete search history.

(56) References Cited

U.S. PATENT DOCUMENTS

| 6,373,454 | B1 | 4/2002 | Knapp et al. | |
| 7,335,914 | B2 * | 2/2008 | Shibusawa | 257/59 |
| 2005/0110726 | A1 * | 5/2005 | Shin | 345/76 |

* cited by examiner

*Primary Examiner*—Richard Hjerpe
*Assistant Examiner*—Andrew Schnirel
(74) *Attorney, Agent, or Firm*—Oblon, Spivak, McClelland, Maier & Neustadt, L.L.P.

(57) ABSTRACT

A display executes a first reset operation during a blanking period, and second and third reset operations and a write operation during each selection period. The first reset operation includes connecting a current source to a precharge circuit and writing a first reset signal into the precharge circuit. The second reset operation includes connecting the current source to a drive circuit of a pixel and writing a second reset signal into the drive circuit to set a potential of a video signal line at a first potential. The third reset operation includes disconnecting the video signal line from the current source and making the precharge circuit output a reset current to the video signal line for a given length of time to shift the potential of the video signal line from the first potential to a second potential.

10 Claims, 4 Drawing Sheets

EL DISPLAY HAVING A BLANKING PERIOD, SCANNING PERIOD INCLUDING PRECHARGE OPERATION, AND DISPLAY PERIOD

CROSS-REFERENCE TO RELATED APPLICATIONS

This application is based upon and claims the benefit of priority from prior Japanese Patent Application No. 2005-105101, filed Mar. 31, 2005, the entire contents of which are incorporated herein by reference.

BACKGROUND OF THE INVENTION

1. Field of the Invention

The present invention relates to a display and a method of driving a display.

2. Description of the Related Art

In a display such as an organic electroluminescent (EL) display which controls the optical characteristics of each display element by a magnitude of a drive current passed through the display element, image quality deterioration such as luminance unevenness occurs if magnitudes of the drive currents vary. Therefore, when an active matrix driving method is used in this display, the characteristics of a drive transistor for controlling the magnitude of the drive current must be substantially the same between pixels. In this display, however, the drive transistors are normally formed on an insulator such as a glass substrate, so their characteristics easily vary.

U.S. Pat. No. 6,373,454 describes an organic EL display using a current mirror circuit in a pixel.

This pixel includes an n-channel field-effect transistor as the drive transistor, an organic EL element, and a capacitor. The source of the drive transistor is connected to a power supply line at a lower electric potential, and the capacitor is connected between the gate of the drive transistor and the power supply line. The anode of the organic EL element is connected to a power supply line at a higher electric potential.

The pixel circuit is driven as described below.

Firstly, the drain of the n-channel field-effect transistor is connected to its gate. A current $I_{sig}$ at a magnitude corresponding to a magnitude of a video signal is made to flow between the drain and source of the n-channel field-effect transistor. This operation sets the voltage between electrodes of the capacitor, equal to a gate-to-source voltage necessary for the n-channel field-effect transistor to pass the current $I_{sig}$ through its channel.

Then, the drain of the n-channel field-effect transistor is disconnected from its gate, and the voltage between the electrodes of the capacitor is maintained. The drain of the n-channel field-effect transistor is subsequently connected to the cathode of the organic EL element. This allows a drive current $I_{drv}$ at a magnitude almost equal to that of the current $I_{sig}$ to flow through the organic EL element. The organic EL element emits light at a luminance corresponding to the magnitude of the drive current $I_{drv}$.

The above configuration makes it possible for the drive current $I_{drv}$, which flows between the drain and source of the n-channel field-effect transistor during a retention period following a write period, to have a magnitude almost equal to a magnitude of the current $I_{sig}$ supplied as a video signal during the write period. Therefore, the influence of not only a threshold value $V_{th}$ but also the mobility, dimensions, and the like of the n-channel field-effect transistor on the drive current $I_{drv}$ can be eliminated.

However, it is difficult for the above display to write the video signal $I_{sig}$ when a magnitude of the drive current $I_{drv}$ corresponds to the video signal $I_{sig}$ is small. Therefore, the display unevenness easily occurs when an image of a low gray level is displayed. Consequently, it is difficult to achieve a contrast ratio as designed.

BRIEF SUMMARY OF THE INVENTION

An object of the present invention is to prevent each gray level within a low gray level range from being displayed higher than the gray level to be displayed in a display which supplies the pixels with current signals as video signals.

According to a first aspect of the present invention, there is provided a display comprising a video signal line, a current source outputting a video signal, a first reset signal, and a second reset signal, pixels arranged along the video signal line and each comprising a drive circuit which is connected to a first power supply terminal and outputs a drive current at a magnitude corresponding to a magnitude of a first input signal, and a display element which includes a pixel electrode, a counter electrode connected to a second power supply terminal, and an active layer interposed therebetween, and a precharge circuit connected to a third power supply terminal and outputting a reset current at a magnitude corresponding to a magnitude of a second input signal, wherein the display is configured to execute a first reset operation during a blanking period, second and third reset operations and a write operation during each selection period, and a display operation during each non-selection period, the first reset operation including connecting the current source to the precharge circuit via the video signal line and writing the first reset signal as the second input signal into the precharge circuit, the second reset operation including connecting the current source to the drive circuit via the video signal line and writing the second reset signal into the drive circuit to set a potential of the video signal line at a first potential, the third reset operation including disconnecting the video signal line from the current source and making the precharge circuit output the reset current as a third reset signal to the video signal line for a given length of time to shift the potential of the video signal line from the first potential to a second potential, the write operation including connecting the current source to the drive circuit via the video signal line and writing the video signal as the first input signal into the drive circuit, and the display operation including connecting the drive circuit to the pixel electrode to make the drive current flow through the display element.

According to a second aspect of the present invention, there is provided a display comprising a video signal line, a current source outputting a video signal, a first reset signal, and a second reset signal, an output control switch connected between the video signal line and the current source, pixels arranged along the video signal line and each comprising a drive transistor whose source is connected to a first power supply terminal, a first capacitor connected between a first constant-potential terminal and a gate of the drive transistor, and a display element including a pixel electrode, a counter electrode connected to a second power supply terminal, and an active layer interposed therebetween, and a precharge circuit comprising a precharge transistor whose source is connected to a third power supply terminal, and a second capacitor connected between a second constant-potential terminal and a gate of the precharge transistor, wherein the display is configured to execute a first reset operation during a blanking period, second and third reset operations and a write operation during each selection period, and a display operation during each non-selection period, the first reset operation including connecting the gate and drain of the precharge transistor to the current source via the video signal line, making the current source output the first reset signal, and thereafter, disconnecting the gate of the precharge transistor from the drain of the precharge transistor and the video signal line, the second reset operation including disconnecting a drain of the drive transistor from the pixel electrode, disconnecting the drain of the precharge transistor from the video signal line, connecting the gate and drain of the drive transistor to the current source via the video signal line, making the current source output the second reset signal, and thereafter, disconnecting the gate of the drive transistor from the drain of the drive transistor and the video signal line, the third reset operation including disconnecting the video signal line from the drain of the drive transistor and the current source, and thereafter, connecting the drain of the precharge transistor to the video signal line for a given length of time, the write operation including connecting the gate and drain of the drive transistor to the current source via the video signal line, making the current source output the video signal, and thereafter, disconnecting the gate of the drive transistor from the drain of the drive transistor and the video signal line, and the display operation including disconnecting the drain of the drive transistor from the video signal line and connecting the drain of the drive transistor to the pixel electrode.

According to a third aspect of the present invention, there is provided a method of driving a display comprising a video signal line, a current source outputting a video signal, a first reset signal, and a second reset signal, pixels arranged along the video signal line and each comprising a drive circuit which is connected to a first power supply terminal and outputs a drive current at a magnitude corresponding to a magnitude of a first input signal, and a display element which includes a pixel electrode, a counter electrode connected to a second power supply terminal, and an active layer interposed therebetween, and a precharge circuit connected to a third power supply terminal and outputting a reset current at a magnitude corresponding to a magnitude of a second input signal, comprising executing a first reset operation during a blanking period, second and third reset operations and a write operation during each selection period, and a display operation during each non-selection period, the first reset operation including connecting the current source to the precharge circuit via the video signal line and writing the first reset signal as the second input signal into the precharge circuit, the second reset operation including connecting the current source to the drive circuit via the video signal line and writing the second reset signal into the drive circuit to set a potential of the video signal line at a first potential, the third reset operation including disconnecting the video signal line from the current source and making the precharge circuit output the reset current as a third reset signal to the video signal line for a given length of time to shift the potential of the video signal line from the first potential to a second potential, the write operation including connecting the current source to the drive circuit via the video signal line and writing the video signal as the first input signal into the drive circuit, and the display operation including connecting the drive circuit to the pixel electrode to make the drive current flow through the display element.

According to a fourth aspect of the present invention, there is provided a method of driving a display comprising a video signal line, a current source outputting a video signal, a first reset signal, and a second reset signal, an output control switch connected between the video signal line and the current source, pixels arranged along the video signal line and each comprising a drive transistor whose source is connected to a first power supply terminal, a first capacitor connected between a first constant-potential terminal and a gate of the drive transistor, and a display element including a pixel electrode, a counter electrode connected to a second power supply terminal, and an active layer interposed therebetween, and a precharge circuit comprising a precharge transistor whose source is connected to a third power supply terminal, and a second capacitor connected between a second constant-potential terminal and a gate of the precharge transistor, comprising executing a first reset operation during a blanking period, second and third reset operations and a write operation during each selection period, and a display operation during each non-selection period, the first reset operation including connecting the gate and drain of the precharge transistor to the current source via the video signal line, making the current source output the first reset signal, and thereafter, disconnecting the gate of the precharge transistor from the drain of the precharge transistor and the video signal line, the second reset operation including disconnecting a drain of the drive transistor from the pixel electrode, disconnecting the drain of the precharge transistor from the video signal line, connecting the gate and drain of the drive transistor to the current source via the video signal line, making the current source output the second reset signal, and thereafter, disconnecting the gate of the drive transistor from the drain of the drive transistor and the video signal line, the third reset operation including disconnecting the video signal line from the drain of the drive transistor and the current source, and thereafter, connecting the drain of the precharge transistor to the video signal line for a given length of time, the write operation including connecting the gate and drain of the drive transistor to the current source via the video signal line, making the current source output the video signal, and thereafter, disconnecting the gate of the drive transistor from the drain of the drive transistor and the video signal line, and the display operation including disconnecting the drain of the drive transistor from the video signal line and connecting the drain of the drive transistor to the pixel electrode.

According to a fifth aspect of the present invention, there is provided a method of driving a display comprising a video signal line, and pixels arranged along the video signal line and each comprising a drive transistor whose source is connected to a power supply terminal, a capacitor connected between a constant-potential terminal and a gate of the drive transistor, and a display element, comprising sequentially selecting the pixels, sequentially executing a first precharge operation, a second precharge operation, and a write operation during a selection period that the pixel is selected, and executing a display operation on each of the non-selected pixels, wherein the first precharge operation includes supplying the video signal line with a first precharge signal as a current signal while connecting the gate and drain of the drive transistor in the selected pixel to the video signal line and disconnecting the gate and drain of the drive transistor in each of the non-selected pixels from the video signal line, wherein the second precharge operation includes supplying the video signal line with a second precharge signal while disconnecting the gate and drain of the drive transistor in each of the pixels from the video signal line so as to set a potential of the video signal line to a reset potential, wherein the write operation includes supplying the video signal line with a video signal as a current signal while connecting the gate and drain of the drive transistor in the selected pixel to the video signal line and disconnecting the gate and drain of the drive transistor in each of the non-selected pixels from the video signal line, and wherein the display operation includes supplying the display element with a drive current which the drive transistor outputs while disconnecting the gate and drain of the drive transistor from the video signal line.

DETAILED DESCRIPTION OF THE INVENTION

Figure 1:
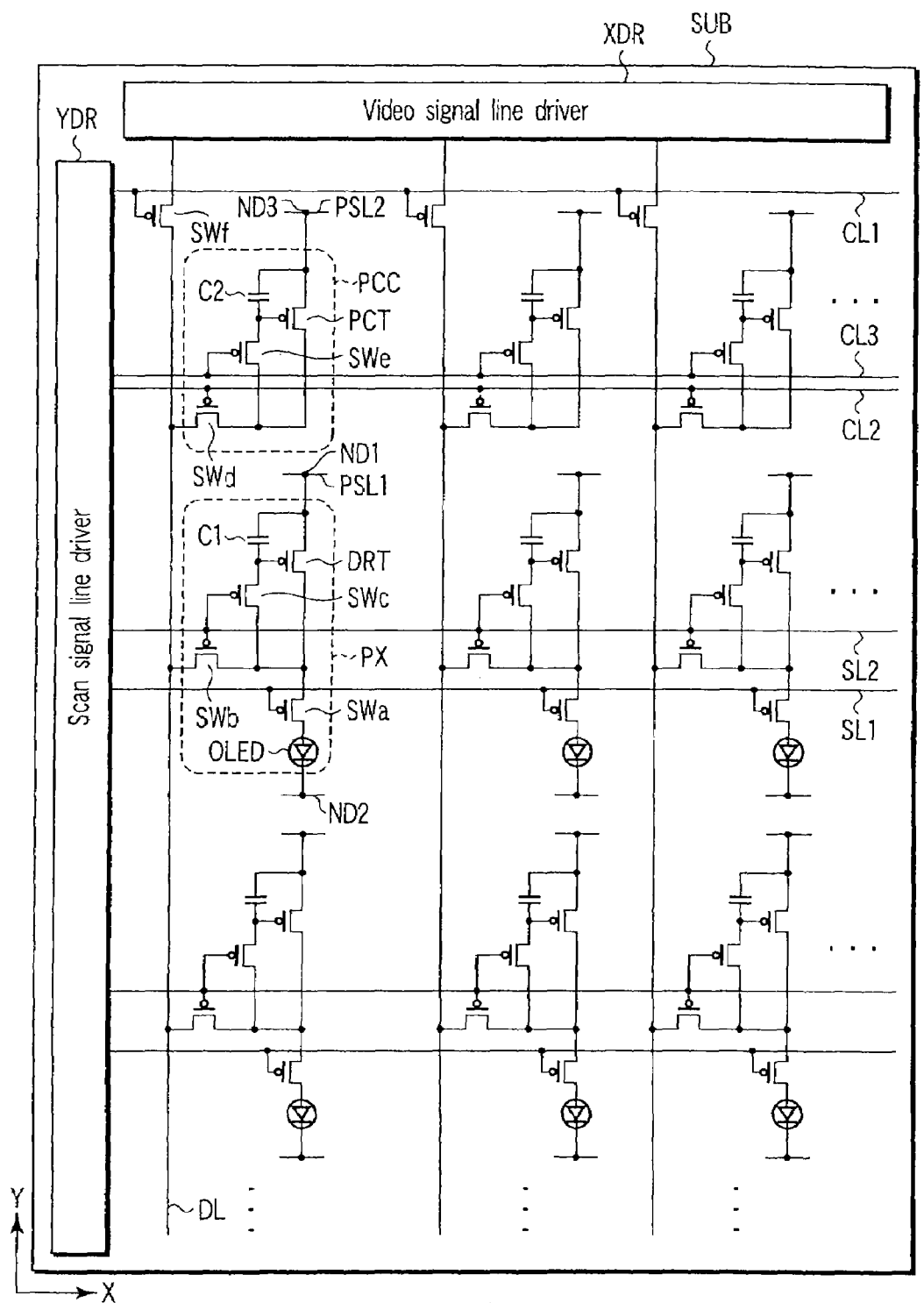
FIG. 1 is a plan view schematically showing a display according to an embodiment of the present invention.

An embodiment of the present invention will be described below in detail with reference to the drawings. In the drawings, components achieving the same or similar functions are denoted by the same reference numerals and duplicate descriptions will be omitted.

Figure 2:
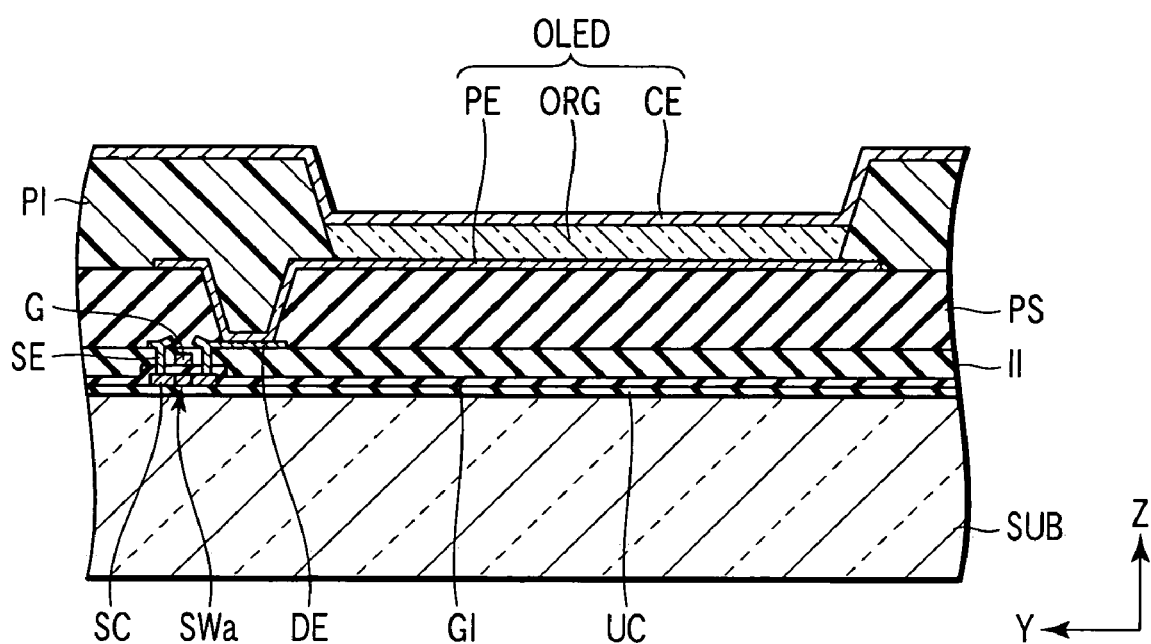
FIG. 2 is a sectional view schematically showing an example of a structure that can be adopted for the display shown in FIG. 1.
Figure 3:
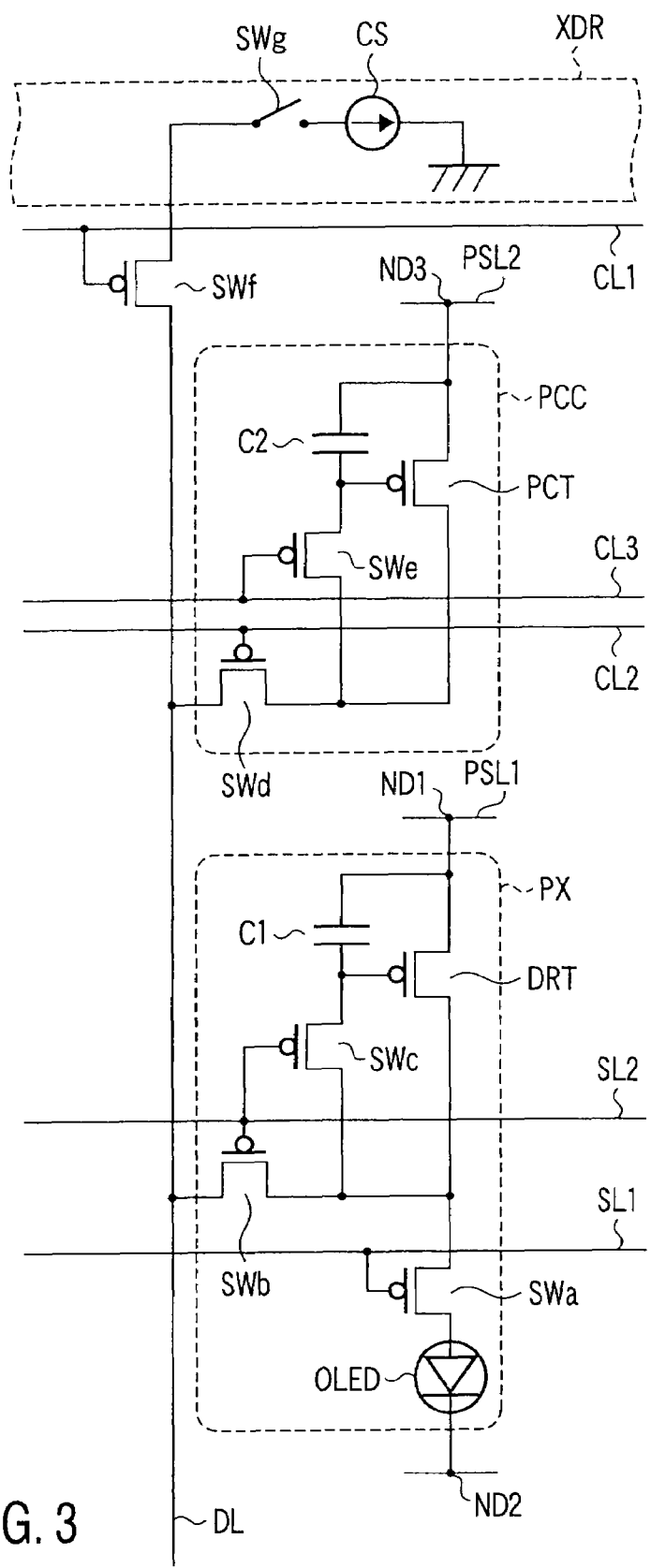
FIG. 3 is an equivalent circuit diagram showing a part of the display shown in FIG. 1.

FIG. 1 is a plan view schematically showing a display according to an embodiment of the present invention. FIG. 2 is a sectional view schematically showing an example of a structure that can be adopted for the display shown in FIG. 1. FIG. 3 is an equivalent circuit diagram showing a part of the display shown in FIG. 1. In FIG. 2, the display is drawn so that its display surface, that is, its front surface or light emitting surface faces the bottom of the drawing, while its rear surface faces the top of the drawing.

The display is a bottom emission organic EL display employing an active matrix driving method. The organic EL display includes an insulating substrate SUB such as a glass substrate.

As an undercoat layer UC shown in FIG. 2, for example, an $SiN_x$ layer and an $SiO_x$ layer are sequentially stacked on the substrate SUB.

Semiconductor layers SC such as polysilicon layers in each of which source and drain are formed, a gate insulator GI which may be formed by using tetraethyl orthosilicate (TEOS), and gates G which are made of, for example, MoW are sequentially stacked on the undercoat layer UC to form top gate-type thin-film transistors. In this embodiment, the thin-film transistors are p-channel thin-film transistors and utilized as drive transistors DRT, precharge transistors PCT, and switches SWa to SWf shown in FIGS. 1 and 3.

Bottom electrodes of capacitors C1 and C2, scan signal lines SL1 and SL2, and control lines CL1 to CL3 shown in FIGS. 1 and 3 are further arranged on the gate insulator GI. These components can be formed in the same step as that for the gates G.

As shown in FIG. 1, the scan signal lines SL1 and SL2 extend along the rows of the pixels PX, i.e., in an X direction, and are arranged in a Y direction along the columns of the pixels PX. The scan signal lines SL1 and SL2 are connected to the scan signal line driver YDR.

The control lines CL1 to CL3 extend in the X direction and arranged in the Y direction. The control lines CL1 to CL3 are connected to the scan signal line driver YDR.

An interlayer insulating film II shown in FIG. 2 covers the gate insulator GI, the gates G, the scan signal lines SL1 and SL2, the control lines CL1 to CL3, and the bottom electrodes of the capacitors C1 and C2. The interlayer insulating film II is, for example, an $SiO_x$ layer formed by plasma CVD. Parts of the interlayer insulating film II are utilized as dielectric layers of the capacitors C1 and C2.

On the interlayer insulating film II, top electrodes of the capacitors C1 and C2 shown in FIGS. 1 and 3, source electrodes SE and drain electrodes DE shown in FIG. 2, and video signal lines DL and power supply lines PSL1 and PSL2 shown in FIGS. 1 and 3 are arranged. These components can be formed in the same step and may have a three-layer structure of, for example, Mo, Al, and Mo.

The source electrodes SE and drain electrodes DE are electrically connected to sources and drains of the thin-film transistors via contact holes formed in the interlayer insulting film II.

As shown in FIG. 1, the video signal lines DL extend in the Y direction and are arranged in the X direction. The video signal lines DL are connected to the video signal line driver XDR.

The power supply lines PSL1 extend in the Y direction and are arranged in the X direction, for example. The power supply line PSL2 extends in the Y direction, for example.

A passivation film PS shown in FIG. 2 covers the source electrodes SE, drain electrodes DE, video signal lines DL, power supply lines PSL1 and PSL2, and top electrodes of the capacitors C1 and C2. The passivation film PS is made of, for example, $SiN_x$.

As shown in FIG. 2, light-transmissive first electrodes PE as front electrodes are arranged on the passivation film PS such that they are spaced apart from one another. Each of the first electrodes PE is a pixel electrode connected through a through-hole formed in the passivation film PS to the drain electrode DE to which the drain of the switch SWa is connected.

In this embodiment, the first electrode PE is an anode. A transparent conductive oxide, for example, indium tin oxide (ITO) can be used as a material of the first electrode PE.

A partition insulating layer PI shown in FIG. 2 is further placed on the passivation film PS. The partition insulating layer PI has through-holes formed at positions corresponding to the first electrodes PE or slits formed at positions corresponding to columns or rows formed by the first electrodes PE. Here, by way of example, the partition insulating layer PI has through-holes formed at positions corresponding to the first electrodes PE.

The partition insulating layer PI is, for example, an organic insulating layer. The partition insulating layer PI can be formed using, for example, a photolithography technique.

An organic layer ORG including an emitting layer is placed on each of the first electrodes PE as an active layer. The emitting layer is, for example, a thin film containing a luminescent organic compound that emits red, green, or blue light. In addition to the emitting layer, the organic layer ORG may include a hole injection layer, a hole transporting layer, a hole blocking layer, an electron transporting layer, and an electron injection layer.

The partition insulating layer PI and the organic layer ORG are covered with a second electrode CE as a counter electrode. The second electrode CE is a common electrode shared among the pixels PX. In this embodiment, the second electrode CE is a light-reflective cathode serving as a back electrode. For example, an electrode wire (not shown) is formed on the layer on which the video signal lines DL are formed, and the second electrode CE is electrically connected to the electrode wire via a contact hole formed in the passivation film PS and partition insulating layer PI. Each organic EL element OLED is composed of the first electrode PE, organic layer ORG, and second electrode CE.

A plurality of the pixels PX are arranged in a matrix on the insulating substrate SUB. Each of the pixels PX is placed near an intersection of the video signal line DL and scan signal line SL1.

Each pixel PX includes the organic EL element OLED as a display element, a drive circuit, and a drive current supply control switch SWa. In this embodiment, as shown in FIGS. 1 and 3, the drive circuit includes a drive transistor DRT, a video signal supply control switch SWb, a diode-connecting switch SWc, and the capacitor C1. As described above, in this embodiment, the drive transistor DR and switches SWa to SWc are p-channel thin-film transistors. The switches SWb and SWc form a first switch group which switches between a first state that the drain and gate of the drive transistor DRT and the video signal line DL are connected to one another and a second state they are disconnected from one another.

The drive transistor DRT, the drive current supply control switch SWa, and the organic EL element OLED are connected in series between a first power supply terminal ND1 and a second power supply terminal ND2 in this order. In this embodiment, the first power supply terminal ND1 is a high-potential power supply terminal connected to a power supply line PSL. The second power supply terminal ND2 is a low-potential power supply terminal. For example, the potentials of the power supply terminals ND1 and ND2 are set at 8V and 0V, respectively.

A gate of the drive current supply control switch SWa is connected to the scan signal line SL1. The video signal supply control switch SWb is connected between the video signal line DL and the drain of the drive transistor DRT. The gate of the video signal supply control switch SWb is connected to the scan signal line SL2. The diode-connecting switch SWc is connected between the drain and gate of the drive transistor DRT. The gate of the diode-connecting switch SWc is connected to the scan signal line SL2.

The capacitor C1 is connected between a first constant-potential terminal and the gate of the drive transistor DRT. In this embodiment, the capacitor C1 is connected between the first power supply terminal ND1 and the gate of the drive transistor DRT.

Precharge circuits PCC are arranged correspondingly with the video signal lines DL on the insulating substrate SUB. Each precharge circuit PCC is placed near the intersection of the video signal line DL and the control line CL2.

As shown in FIGS. 1 and 3, each precharge circuit PCC includes a precharge transistor PCT, a reset signal supply control switch SWd, a diode-connecting switch SWe, and a capacitor C2. As described above, the precharge transistor PCT and switches SWd and SWe are p-channel thin-film transistors. The switches SWd and SWe form a second switch group which switches among a first state that the drain and gate of the precharge transistor PCT and the video signal line DL are connected to one another, a second state that they are disconnected from one another, and a third state that the gate is disconnected from the drain and the video signal line DL and the drain is connected the video signal line DL.

The precharge transistor PCT and the reset signal supply control switch SWd are connected in series between a third power supply terminal ND3 and the second power supply terminal ND2 in this order. In this embodiment, the third power supply terminal ND3 is connected to the power supply line PSL2 and a high-potential terminal higher in potential than the second power supply terminal ND2. For example, the potential of the third power supply terminal ND3 is set at 10V.

The gate of the reset signal supply control switch SWd is connected to the control line CL2. The diode-connecting switch SWe is connected between the drain and gate of the precharge transistor PCT. The gate of the diode-connecting switch SWe is connected to the control line CL3.

The capacitor C2 is connected between a second constant-potential terminal and the gate of the precharge transistor PCT. In this embodiment, the second constant-potential terminal is connected to the third power supply terminal ND3.

A video signal line driver XDR is placed on the insulating substrate SUB. As shown in FIG. 3, the video signal line driver XDR includes current sources CS and switches SWg correspondently with the video signal lines DL. The current source CS and the switch SWg are connected in series between a ground wire and an output terminal of the video signal line driver XDR in this order. The current source CS outputs a video signal, a first reset signal, and a second reset signal as current signals. The first and second reset signals are constant-current whose magnitudes are sufficiently large, for example, 3.0 µA.

A scan signal line drive YDR is placed on the insulating substrate SUB. As described above, the scan signal lines SL1 and SL2 and the control lines CL1 to CL3 are connected to the scan signal line driver YDR.

Output control switches SWf are arranged correspondently with the video signal lines DL on the insulating substrate SUB. Each output control switch SWf is connected between the video signal line DL and the output terminal of the video signal line driver XDR, and its gate is connected to the control line CL1.

Note that an array substrate corresponds to a structure in which the video signal line driver XDR, the scan signal line driver YDR, the organic layer ORG and the second electrode CE are omitted from the organic EL display, or a structure in which the video signal line driver XDR, the scan signal line driver YDR, the partition insulating layer PI, the organic layer ORG and the second electrode CE are omitted from the organic EL display. The array substrate may includes the video signal line driver XDR and/or the scan signal line driver YDR.

The organic EL display is driven by, for the example, the method described below.

Figure 4:
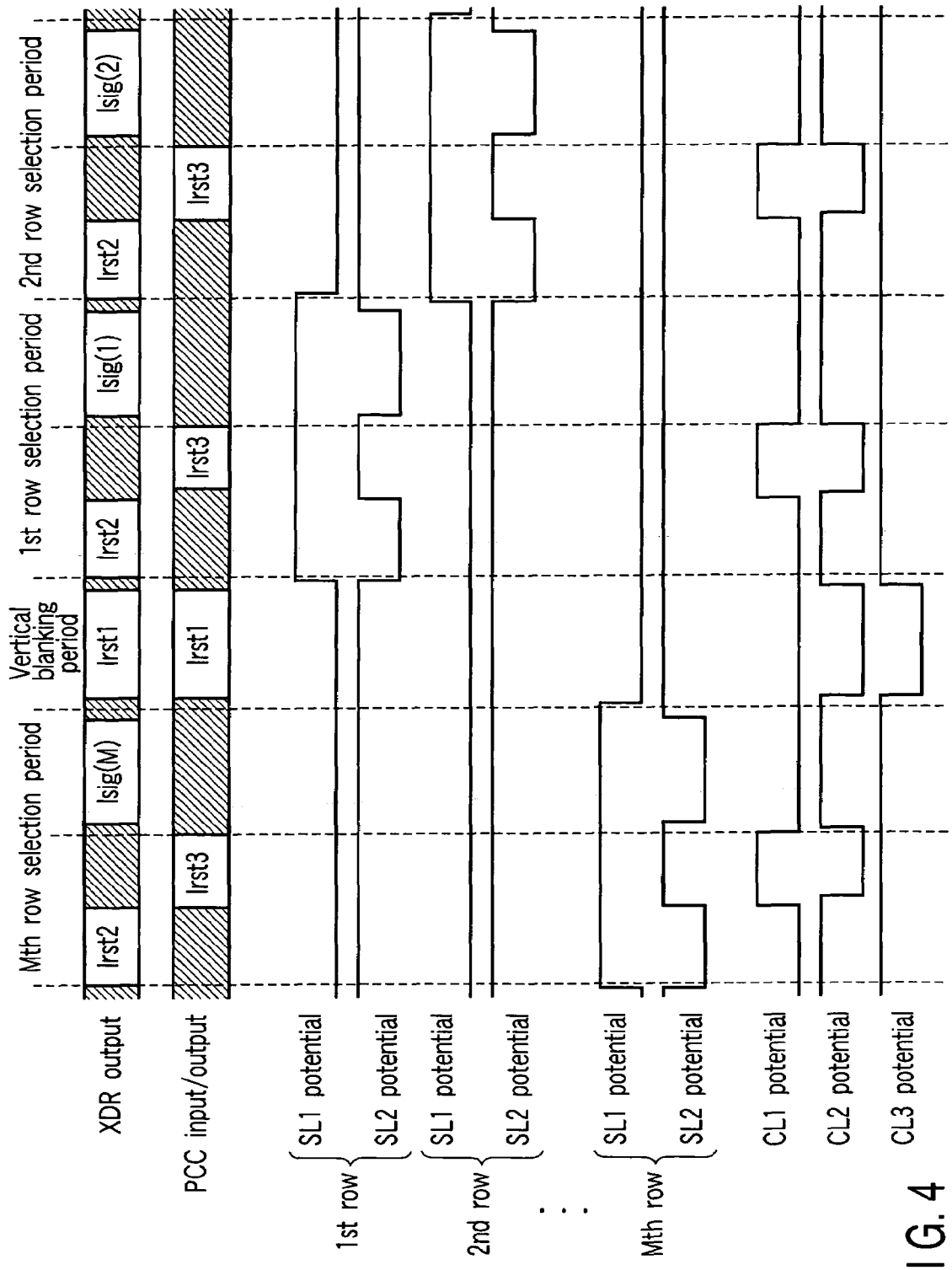
FIG. 4 is a timing chart schematically showing an example of a method of driving the display shown in FIG. 1.

FIG. 4 is a timing chart schematically showing an example of a method of driving the display shown in FIG. 1. FIG. 4 illustrates a driving method in the case that the number of rows which the pixels form is M. In the figure, the abscissa indicates time, while the ordinate indicates potential.

As for the "XDR output" in FIG. 4, during the period shown as "$I_{sig}(m)$", the video signal line driver XDR outputs a video signal $I_{sig}(m)$ to the video signal line DL. During the period shown as "$I_{rst}1$", the video signal line driver XDR outputs a first reset signal $I_{rst}1$ to the video signal line DL. During the period shown as "$I_{rst}2$", the video signal line driver XDR outputs a second reset signal $I_{rst}2$ to the video signal line DL. As for the "PCC input/output" in FIG. 4, during the period shown as "$I_{rst}1$", the first reset signal $I_{rst}1$ is input to the precharge circuit PCC. During the period shown as "$I_{rst}3$", the precharge circuit PCC outputs a third reset signal $I_{rst}3$ to the video signal line DL. In FIG. 4, the waveforms shown as "SL1 potential" and "SL2 potential" represent the potentials of the scan signal lines SL1 and SL2, respectively. In FIG. 4, the waveforms shown as "CL1 potential" to "CL3 potential" represent the potentials of the control signal lines CL1 to CL3, respectively. Note that the second and third reset signals correspond to first and second precharge signals, respectively.

According to this method, a blanking period (vertical blanking period) and an effective scanning period are repeated alternately. A first reset operation is executed during the blanking period, and rows of pixels PX are sequentially selected during the effective scanning period. During each selection period over which a row of the pixels PX is selected, a second reset operation, a third reset operation, and a write operation are sequentially executed. During each non-selection period over which a row of the pixels PX is not selected, a display operation is executed. Note that each non-selection period partially overlaps the blanking period. Note also that the second and third reset operations correspond to first and second precharge operations, respectively.

The first reset operation includes connecting the precharge circuit PCC to the current source CS via the video signal line DL to write the first reset signal $I_{rst}1$ to the precharge circuit PCC. That is, firstly, the switches SWe and SWd are closed while the switch SWf is kept closed (conduction state). In this state, the switch SWg is closed to make the first reset current $I_{rst}1$, whose magnitude is, for example, 3.0 µA, flow between the third power supply terminal ND3 and the video signal line DL. As a result, the gate-to-source voltage of the precharge transistor PCT is set at a value when the precharge transistor PCT allows the first reset current $I_{rst}1$ to flow. Thereafter, the switches SWd to SWf are opened. The switch SWe are kept open until the next first reset operation is started so as to maintain the gate-to-source voltage of the precharge transistor PCT over the effective scanning period.

During a period over which an m-th row of the pixels PX is selected, i.e., m-th row selection period, the switch SWa of each pixel PX in the selected row is opened at first. During the period over which the switch SWa is open, the second reset operation, the third reset operation, and the write operation are executed sequentially.

The second reset operation includes connecting the drive circuit to the current source CS via the video signal line DL and writing the second reset signal $I_{rst}2$ to the drive circuit so as to set the potential of the video signal line DL at a first potential $V_1$. That is, the switches SWb and SWc are closed while the switch SWf is kept closed. In this state, the switch SWg is closed and a second reset current $I_{rst}2$, whose magnitude is, for example, 3.0 µA, as the second reset signal is made to flow between the first power supply terminal ND1 and the video signal line DL. The switches SWa, SWd and SWe are kept open. As a result, the gate potential of the drive transistor DRT is set at a value $V_1$ when the second reset current $I_{rst}2$ flows between the source and drain of the drive transistor DRT. That is, the potential of the video signal line DL is set at the first potential $V_1$. Subsequently, the switches SWb, SWc and SWg are opened.

The third reset operation following the second reset operation includes disconnecting the video signal line DL from the current source CS and make the precharge circuit PCC output a third reset signal $I_{rst}3$ to the video signal line DL for a certain time period so as to shift the potential of the video signal line DL from the first potential $V_1$ to a second potential $V_2$, which corresponds to a reset potential. That is, firstly, the switch SWf is opened and the switch SWd is closed while the switches SWa to SWc and SWe to SWg are kept open. When a certain time period is elapsed after closing the switch SWd, the switch SWd is opened. During the period over which the switch SWd is closed, the precharge circuit PCC continues to output the third reset signal $I_{rst}3$, whose magnitude is almost equal to the magnitude of the reset signal $I_{rst}1$, to the video signal line DL. As a result, the potential of the video signal line DL shifts from the first potential $V_1$ to the second potential $V_2$. For example, provided that the wiring capacitance of the video signal line DL is about 10 pF, the potential of the video signal line DL raises by about 3V by allowing the precharge circuit PCC to output the third reset signal $I_{rst}3$ of about 3.0 µA to the video signal line DL for 5 microseconds.

The write operation following the third reset operation includes connecting the drive circuit to the current source CS via the video signal line DL and writing the video signal $I_{sig}(m)$ to the drive circuit. Firstly, the switches SWb, SWc, and SWf are closed. In this state, the switch SWg is closed, and the write current $I_{sig}(m)$ is made to flow between the first power supply terminal ND1 and the video signal line DL as a video signal while the switches SWa, SWd, and SWe are kept open. As a result, the gate potential of the drive transistor DRT is set to a third potential $V_3$, which is the gate potential of the drive transistor DRT when the write current $I_{sig}(m)$ flows between the source and drain of the drive transistor DRT. Subsequently, the switches SWb, SWc and SWg are opened, and then, the switch SWa is closes. That is, the display operation is started.

During the non-selection period following the selection period, the display operation is continued. The display operation includes connecting the pixel electrode PE to the drive circuit to allow a drive current $I_{drv}(m)$ to flow through the organic EL element OLED. That is, in the non-selected pixel, the switch SWa is kept closed, and the switches SWb and SWc are kept open. During the period over which the switch SWa is closed, the drive current $I_{drv}(m)$ whose magnitude corresponds to the magnitude of the write current $I_{sig}(m)$ flows through the organic EL element OLED. The organic EL element OLED emits light at a luminance corresponding to the magnitude of the drive current $I_{drv}(m)$.

In an organic EL display not including the precharge circuit PCC, after displaying a gray level within a high gray level range on the pixels PX in the m-th row, the potential of the video signal line at the time starting the m+1-th row selection period is set much lower than the sum $V_{dd}+V_{th}$, which is a potential corresponding to the lowest gray level, of the potential $V_{dd}$ of the first power supply terminal ND1 and the threshold voltage $V_{th}$ of the drive transistor DRT. Thus, in order to display a gray level within a low gray level range on the pixels in the m+1-th row, the potential of the video signal line DL must be greatly increased by the write operation during the m+1-th row selection period. In other words, the potential of the video signal line DL must be significantly changed in spite of the small magnitude of the write current $I_{sig}(m+1)$. Therefore, it is difficult to accurately set the gate potential of the drive transistor DRT at the value corresponding to the write current $I_{sig}(m+1)$ through the write operation during the m+1-th row selection period.

In contrast, according to the driving method described with reference to FIG. 4, the potential of the video signal line DL is set equal to the first potential $V_1$ by the second reset operation, and raised from the first potential $V_1$ to the second potential $V_2$ by the third by the third reset operation. Thus, when the second potential $V_2$ is sufficiently high, it is unnecessary to greatly raise the potential of the video signal line DL by the write operation during the m+1-th row selection period in order for displaying a gray level within the low gray level range on the pixels in the m+1-th row. Therefore, according to the driving method, it is possible to prevent each gray level within the low gray level range from being displayed higher than the gray level to be displayed.

Moreover, the first potential $V_1$ of the video signal line DL just after finishing the second reset operation reflects the threshold voltage $V_{th}$ of the drive transistor DRT. Since the difference $V_2-V_1$ is constant, the second potential $V_2$ also reflects the threshold voltage $V_{th}$ of the drive transistor DRT. That is, the second potential $V_2$ varies among the pixels PX correspondently with a variation in threshold voltage $V_{th}$ among the pixels PX. Thus, by setting the second potential $V_2$ almost equal to the third potential $V_3$ which corresponds to the lowest gray level, it is possible to make the effect of the threshold voltage $V_{th}$ on the drive current $I_{drv}$ almost equal among the pixels PX even in the case where the change from the second potential $V_2$ to the third potential $V_3$ hardly occurs due to the significantly small magnitude of the write current $I_{sig}$. This driving method, therefore, prevents a display unevenness from occurring when a low-gray-level image is displayed.

As described above, according to the driving method, it is possible to prevent each gray level within the low gray level range from being displayed higher than the gray level to be displayed, and further prevent a display unevenness from occurring when a low-gray-level image is displayed. In addition, the driving method makes it possible to display gray levels within the middle gray level range and the high gray level range with a high reproducibility. That is, the driving method can display all the gray levels with a high reproducibility.

In the present embodiment, the structure in FIG. 3 is adopted for the pixels PX. However, other structures can be adopted for the pixels PX. For example, the diode-connecting switch SWc may be connected between the drain of the drive transistor DRT and the video signal line DL instead of being connected between the drain and gate of the drive transistor DRT. Alternatively, the video signal supply control switch SWb may be connected between the gate of the drive transistor DRT and the video signal line DL instead of being connected between the drain of the drive transistor DRT and the video signal line DL.

In the present embodiment, the structure in FIG. 3 is adopted for the precharge circuit PCC. However, another structure can be adopted for the precharge circuit PCC. For example, the diode-connecting switch SWe may be connected between the drain of the precharge transistor PCT and the video signal line instead of being connected between the drain and gate of the precharge transistor PCT.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A display comprising:
 a video signal line;
 a current source outputting a video signal, a first reset signal, and a second reset signal;
 pixels arranged along the video signal line and each comprising a drive circuit which is connected to a first power supply terminal and outputs a drive current at a magnitude corresponding to a magnitude of a first input signal, and a display element which includes a pixel electrode, a counter electrode connected to a second power supply terminal, and an active layer interposed therebetween; and
 a precharge circuit connected to a third power supply terminal and outputting a reset current at a magnitude corresponding to a magnitude of a second input signal,
 wherein the display is configured to execute a first reset operation during a blanking period, second and third reset operations and a write operation during each selection period, and a display operation during each non-selection period, the first reset operation including connecting the current source to the precharge circuit via the video signal line and writing the first reset signal as the second input signal into the precharge circuit, the second reset operation including connecting the current source to the drive circuit via the video signal line and writing the second reset signal into the drive circuit to set a potential of the video signal line at a first potential, the third reset operation including disconnecting the video signal line from the current source and making the precharge circuit output the reset current as a third reset signal to the video signal line for a given length of time to shift the potential of the video signal line from the first potential to a second potential, the write operation including connecting the current source to the drive circuit via the video signal line and writing the video signal as the first input signal into the drive circuit, and the display operation including connecting the drive circuit to the pixel electrode to make the drive current flow through the display element.

2. The display according to claim 1, wherein the drive circuit includes a drive transistor whose source is connected to the first power supply terminal, and a first capacitor connected between a first constant-potential terminal and a gate of the drive transistor, and
 wherein the precharge circuit includes a precharge transistor whose source is connected to the third power supply terminal, and a second capacitor connected between a second constant-potential terminal and a gate of the precharge transistor.

3. The display according to claim 2, further comprising an output control switch connected between the video signal line and the current source,
 wherein the drive circuit further includes a first switch group which switches a connection state between first and second states, the first state being a state that drain and gate of the drive transistor and the video signal line are connected to one another, and the second state being a state that the drain and gate of the drive transistor and the video signal line are disconnected from one another,
 wherein the precharge circuit further includes a second switch group which switches a connection state among third to fifth states, the third state being a state that drain and gate of the precharge transistor and the video signal line are connected to one another, the fourth state being a state that the drain and gate of the precharge transistor and the video signal line are disconnected from one another, and the fifth state being a state that the drain of the precharge transistor is disconnected from the gate of the precharge transistor and is connected to the video signal line, and
 wherein each of the pixels further comprises a drive current supply control switch connected between the drain of the drive transistor and the pixel electrode.

4. The display according to claim 1, wherein the display element is an organic EL display.

5. A display comprising:
 a video signal line;
 a current source outputting a video signal, a first reset signal, and a second reset signal;
 an output control switch connected between the video signal line and the current source;
 pixels arranged along the video signal line and each comprising a drive transistor whose source is connected to a first power supply terminal, a first capacitor connected between a first constant-potential terminal and a gate of the drive transistor, and a display element including a pixel electrode, a counter electrode connected to a second power supply terminal, and an active layer interposed therebetween; and a precharge circuit comprising a precharge transistor whose source is connected to a third power supply terminal, and a second capacitor connected between a second constant-potential terminal and a gate of the precharge transistor, wherein the display is configured to execute a first reset operation during a blanking period, second and third reset operations and a write operation during each selection period, and a display operation during each non-selection period, the first reset operation including connecting the gate and drain of the precharge transistor to the current source via the video signal line, making the current source output the first reset signal, and thereafter, disconnecting the gate of the precharge transistor from the drain of the precharge transistor and the video signal line, the second reset operation including disconnecting a drain of the drive transistor from the pixel electrode, disconnecting the drain of the precharge transistor from the video signal line, connecting the gate and drain of the drive transistor to the current source via the video signal line, making the current source output the second reset signal, and thereafter, disconnecting the gate of the drive transistor from the drain of the drive transistor and the video signal line, the third reset operation including disconnecting the video signal line from the drain of the drive transistor and the current source, and thereafter, connecting the drain of the precharge transistor to the video signal line for a given length of time, the write operation including connecting the gate and drain of the drive transistor to the current source via the video signal line, making the current source output the video signal, and thereafter, disconnecting the gate of the drive transistor from the drain of the drive transistor and the video signal line, and the display operation including disconnecting the drain of the drive transistor from the video signal line and connecting the drain of the drive transistor to the pixel electrode.

6. The display according to claim 5, wherein the each of the pixels further comprises a first switch group which switches a connection state between first and second states, and a drive current supply control switch connected between the drain of the drive transistor and the pixel electrode, the first state being a state that the drain and gate of the drive transistor and the video signal line are connected to one another, and the second state being a state that the drain and gate of the drive transistor and the video signal line are disconnected from one another, and wherein the precharge circuit further comprises a second switch group which switches a connection state among third to fifth states, the third state being a state that the drain and gate of the precharge transistor and the video signal line are connected to one another, the fourth state being a state that the drain and gate of the precharge transistor and the video signal line are disconnected from one another, and the fifth state being a state that the drain of the precharge transistor is disconnected from the gate of the precharge transistor and is connected to the video signal line.

7. The display according to claim 5, wherein the display element is an organic EL display.

8. A method of driving a display comprising a video signal line, a current source outputting a video signal, a first reset signal, and a second reset signal, pixels arranged along the video signal line and each comprising a drive circuit which is connected to a first power supply terminal and outputs a drive current at a magnitude corresponding to a magnitude of a first input signal, and a display element which includes a pixel electrode, a counter electrode connected to a second power supply terminal, and an active layer interposed therebetween, and a precharge circuit connected to a third power supply terminal and outputting a reset current at a magnitude corresponding to a magnitude of a second input signal, comprising:

executing a first reset operation during a blanking period, second and third reset operations and a write operation during each selection period, and a display operation during each non-selection period, the first reset operation including connecting the current source to the precharge circuit via the video signal line and writing the first reset signal as the second input signal into the precharge circuit, the second reset operation including connecting the current source to the drive circuit via the video signal line and writing the second reset signal into the drive circuit to set a potential of the video signal line at a first potential, the third reset operation including disconnecting the video signal line from the current source and making the precharge circuit output the reset current as a third reset signal to the video signal line for a given length of time to shift the potential of the video signal line from the first potential to a second potential, the write operation including connecting the current source to the drive circuit via the video signal line and writing the video signal as the first input signal into the drive circuit, and the display operation including connecting the drive circuit to the pixel electrode to make the drive current flow through the display element.

9. A method of driving a display comprising a video signal line, a current source outputting a video signal, a first reset signal, and a second reset signal, an output control switch connected between the video signal line and the current source, pixels arranged along the video signal line and each comprising a drive transistor whose source is connected to a first power supply terminal, a first capacitor connected between a first constant-potential terminal and a gate of the drive transistor, and a display element including a pixel electrode, a counter electrode connected to a second power supply terminal, and an active layer interposed therebetween, and a precharge circuit comprising a precharge transistor whose source is connected to a third power supply terminal, and a second capacitor connected between a second constant-potential terminal and a gate of the precharge transistor, comprising:

executing a first reset operation during a blanking period, second and third reset operations and a write operation during each selection period, and a display operation during each non-selection period, the first reset operation including connecting the gate and drain of the precharge transistor to the current source via the video signal line, making the current source output the first reset signal, and thereafter, disconnecting the gate of the precharge transistor from the drain of the precharge transistor and the video signal line, the second reset operation including disconnecting a drain of the drive transistor from the pixel electrode, disconnecting the drain of the precharge transistor from the video signal line, connecting the gate and drain of the drive transistor to the current source via the video signal line, making the current source output the second reset signal, and thereafter, disconnecting the gate of the drive transistor from the drain of the drive transistor and the video signal line, the third reset operation including disconnecting the video signal line from the drain of the drive transistor and the current source, and thereafter, connecting the drain of the precharge transistor to the video signal line for a given length of time, the write operation including connecting the gate and drain of the drive transistor to the current source via the video signal line, making the current source output the video signal, and thereafter, disconnecting the gate of the drive transistor from the drain of the drive transistor and the video signal line, and the display operation including disconnecting the drain of the drive transistor from the video signal line and connecting the drain of the drive transistor to the pixel electrode.

10. A method of driving a display comprising a video signal line, a current source outputting a video signal, and pixels arranged along the video signal line and each comprising a drive transistor whose source is connected to a power supply terminal, a capacitor connected between a constant-potential terminal and a gate of the drive transistor, a precharge circuit connected to a power supply and outputting first and second precharge signals, and a display element, comprising:

sequentially selecting the pixels;

sequentially executing a first precharge operation, a second precharge operation, and a write operation during a selection period that the pixel is selected; and executing a display operation on each of the non-selected pixels, wherein the first precharge operation includes supplying the video signal line with the first precharge signal as a current signal while connecting the gate and drain of the drive transistor in the selected pixel to the video signal line and disconnecting the gate and drain of the drive transistor in each of the non-selected pixels from the video signal line, wherein the second precharge operation includes supplying the video signal line with the second precharge signal while disconnecting the gate and drain of the drive transistor in each of the pixels from the video signal line so as to set a potential of the video signal line to a reset potential, wherein the write operation includes supplying the video signal line with the video signal as a current signal while connecting the gate and drain of the drive transistor in the selected pixel to the video signal line and disconnecting the gate and drain of the drive transistor in each of the non-selected pixels from the video signal line, and wherein the display operation includes supplying the display element with a drive current which the drive transistor outputs while disconnecting the gate and drain of the drive transistor from the video signal line.

* * * * *